(12) United States Patent
Kim (10) Patent No.: US 7,639,555 B1
(45) Date of Patent: Dec. 29, 2009

(54) TEST CIRCUIT DEVICE FOR SEMICONDUCTOR MEMORY APPARATUS

(75) Inventor: Seung Bong Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/345,770

(22) Filed: Dec. 30, 2008

(30) Foreign Application Priority Data

Jun. 4, 2008 (JP) .................. 10-2008-0052697

(51) Int. Cl.
*G11C 29/00* (2006.01)
(52) U.S. Cl. ............. 365/201; 365/185.23; 365/230.06; 365/185.22
(58) Field of Classification Search ............ 365/185.23, 365/230.06, 201, 185.22
See application file for complete search history.

(56) References Cited

U.S. PATENT DOCUMENTS 5,811,815 A 9/1998 Marshall et al.

6,236,617 B1 * 5/2001 Hsu et al. .............. 365/230.06

FOREIGN PATENT DOCUMENTS

JP         09-134592         5/1997

* cited by examiner

*Primary Examiner*—Hoai V Ho
*Assistant Examiner*—Jason Lappas
(74) *Attorney, Agent, or Firm*—Baker & McKenzie LLP (57) ABSTRACT

A test circuit device for a semiconductor memory device includes a main word line driving unit that generates a signal that swings between a driving voltage and one of a first voltage and a second voltage in response to a main decoding signal and a test mode signal, a local driving unit that generates a signal that swings between the driving voltage and one of the first voltage and the second voltage in response to a local decoding signal and the test mode signal, a driving voltage supplying unit that receives an output of the local driving unit and the test mode signal to supply a voltage that swings between the driving voltage and the first voltage, and a sub-word line driver that receives an output of the main word line driving unit and an output of the driving voltage supplying unit to determine whether the sub-word line is enabled or not.

22 Claims, 4 Drawing Sheets

TEST CIRCUIT DEVICE FOR SEMICONDUCTOR MEMORY APPARATUS

The present application claims priority under 35 U.S.C. § 119(a) to Korean application number 10-2008-0052697, filed on Jun. 4, 2008, in the Korean Intellectual Property Office, which is incorporated herein by reference in its entirety as if set forth in full.

BACKGROUND

1. Technical Field

The embodiments described herein relate to a design of a semiconductor memory apparatus, and in particular, to a test circuit device for a semiconductor memory apparatus.

2. Related Art

As the capacity of semiconductor memory devices increases, the total number of individual memory cells within a given area of the semiconductor memory apparatus increases. Accordingly, the probability of a micro-bridge being established between adjacent word lines WL and bit lines BL increases.

Figure 1:
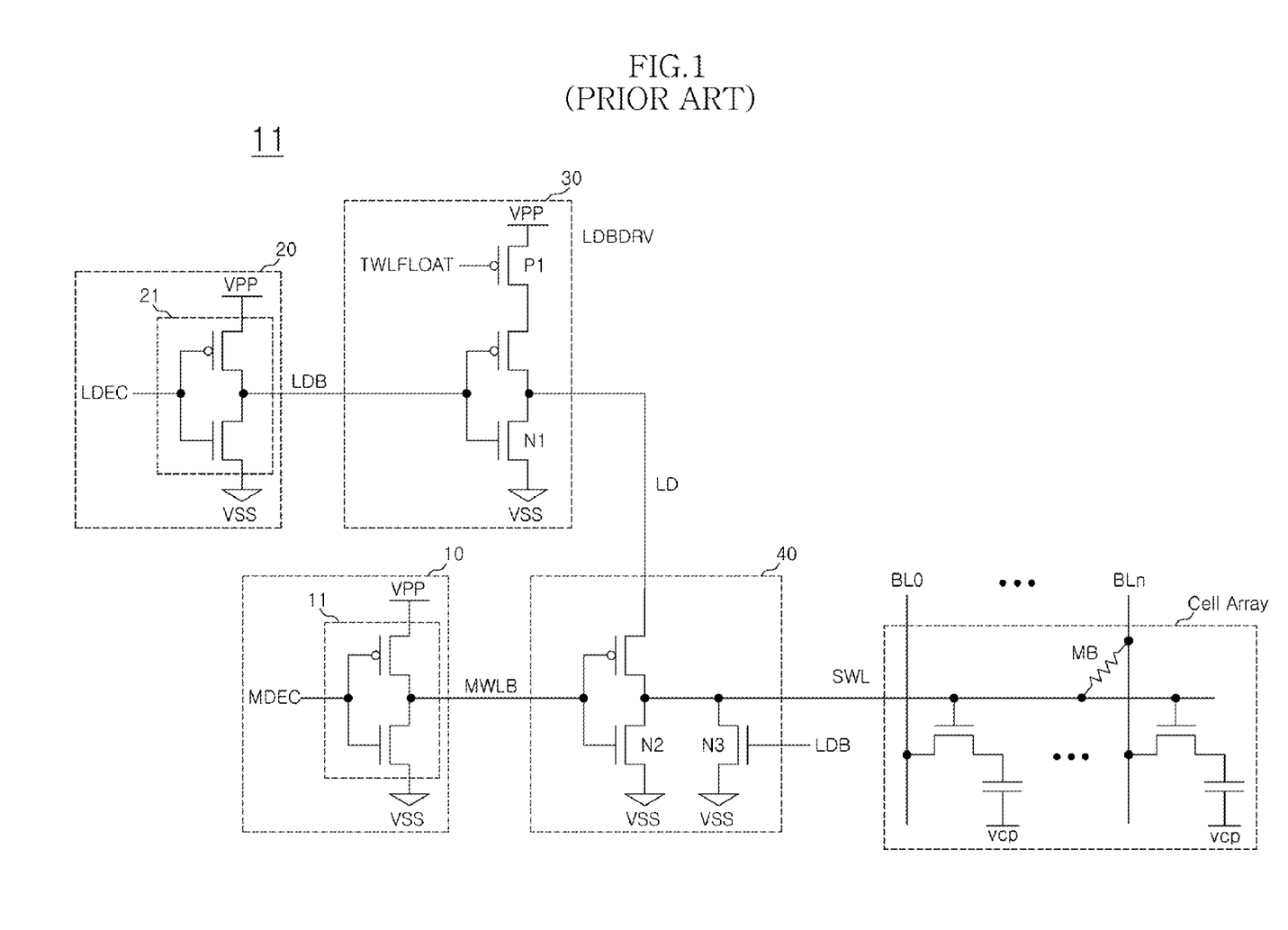
FIG. 1 is a schematic circuit diagram of a conventional micro-bridge detection circuit of a semiconductor memory apparatus.

FIG. 1 is a schematic circuit diagram of a conventional micro-bridge detection circuit of a semiconductor memory apparatus. In FIG. 1, a micro-bridge detection circuit 11 of a semiconductor memory apparatus includes a main word line driver 10, a local driver 20, a driving voltage supplying unit 30, and a sub word line driver 40.

The main word line driver 10 includes a first inverter circuit 11 that receives a main decoding signal 'MDEC' to supply a signal that swings between a driving voltage VPP and a ground voltage VSS to the sub-word line driver 40. The local driver 20 includes a second inverter 21 that receives a local decoding signal 'LDEC' to supply a signal that swings between the driving voltage VPP and the ground voltage VSS to the driving voltage supplying unit 30. The driving voltage supplying unit 30 receives an output signal 'LDB' from the local driver 20 and a word floating test mode signal 'TWLFLOAT', and supplies the driving voltage VPP as an output signal 'LD' to the sub-word line driver 40. The sub-word line driver 40 determines whether or not the sub-word line SWL is enabled in response to output signals 'MWLB', 'LDB', and 'LD' of the main word line driver 10, the local driver 20, and the driving voltage supplying unit 30, respectively.

The unit arrangement of FIG. 1 is configured by a plurality of cell arrays in accordance with the configuration of the memory apparatus. For purposes of explanation, the cell array of FIG. 1 is added to assist with describing operations of the micro-bridge detection circuit 1, and a minute bridge that is generated due to the presence of the micro-bridge between the word line and the bit line is schematically represented as a resistor MB.

Figure 2:
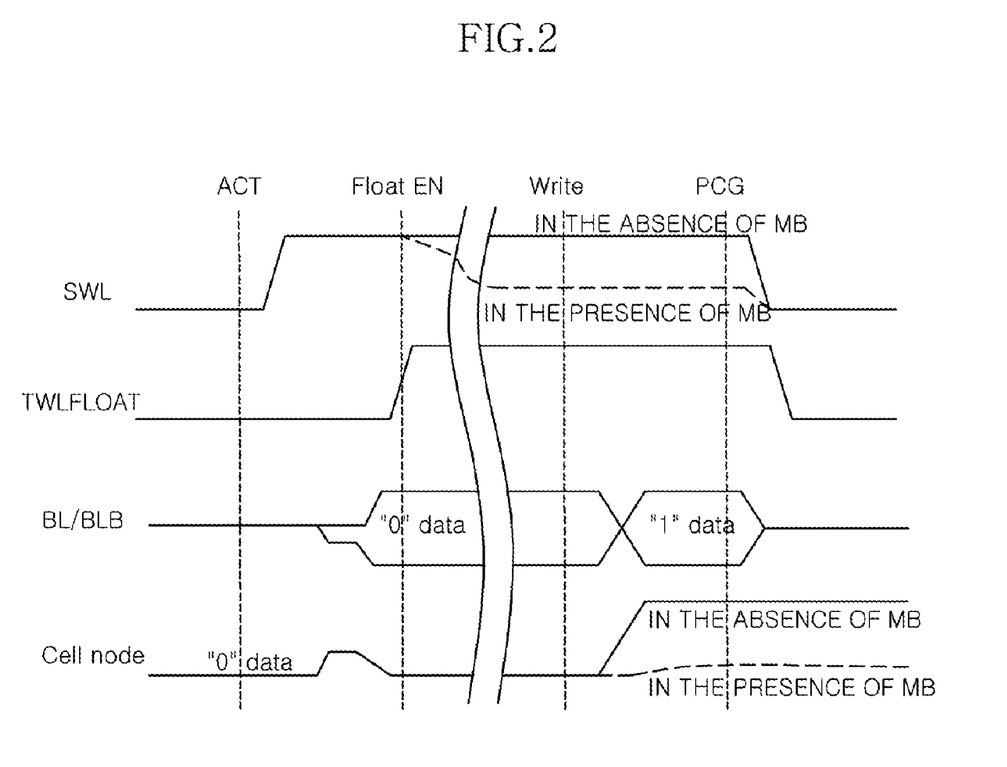
FIG. 2 is a diagram representing conventional operation signals of a circuit according to the presence/absence of a micro-bridge.

FIG. 2 is a diagram representing conventional operation signals of a circuit according to the presence/absence of a micro-bridge. In FIGS. 1 and 2, in a state where data "0" is stored in a memory cell of a semiconductor memory apparatus at an initial stage, when an active command signal 'ACT' is input, the main decoding signal 'MDEC' and the local decoding signal 'LDEC' are enabled at a high level. The first inverter circuit 11 of the main word line driver 10, to which the main decoding signal 'MDEC' is input, supplies an output signal 'MWLB' that is enabled at a low level to the sub-word line 40. The second inverter circuit 21 of the local driver 20, to which the local decoding signal 'LDEC' is input, supplies an output signal 'LDB' that is enabled at a low level to the driving voltage supplying unit 30. In this case, the word line floating test mode signal 'TWLFLOAT' is maintained to be disabled at a low level. Thus, a PMOS transistor P2 that receives a low word line floating test mode signal 'TWLFLOAT' is turned ON, and the driving voltage supplying unit 30 that receives the output signal 'LDB' of the local driver, which is enabled at a low level, supplies the driving voltage VPP to the sub-word line driver 40.

The sub-word line driver 40 causes the sub-word line SWL to be enabled in response to the output signal 'MWLB' of the main word line driver 10 that is enabled at a low level and the output signal 'LDB' of the driving voltage supplying unit 30. When the sub-word line SWL is enabled, a bit line and a bit (bar) $\overline{BL}$ line are amplified by a bit line sense amplifier. In addition, after the charge sharing operation, data "0" is stored in the memory cell node. In this case, if the word line floating test mode signal 'TWLFLOAT' is enabled at a high level, then the PMOS transistor P2 of the driving voltage supplying unit 30 that receives the word line floating test mode signal 'TWLFLOAT' through a gate terminal is turned OFF. Thus, the driving voltage VPP that is supplied to the sub-word line driver 40 is intercepted and the sub-word line SWL is in a floating state. If the floating state is maintained for a long time period, the micro-bridge MB is generated between the sub-word line and the bit line so that the level of the sub-word line SWL is reduced to the ground voltage VSS level. Specifically, a current path is generated from the sub-word line SWL to the bit line so that the level of the sub-word line SWL is reduced to the ground voltage VSS level.

In the floating state, if data "1" is intended to be written into a memory cell by a write command, then the data "1" is transmitted to the bit line. However, since the level of the sub-word line SWL is reduced to the ground voltage level VSS, the memory cell node cannot store the data "1", and instead holds data "0". After completing the write operation, if the precharge command PCG is performed, then the word line floating test mode signal 'TWLFLOAT' is disabled. Next, when the active command is input again, the memory cell fails to read the data "1", and thus, indicates that the micro-bridge MB is present. In contrast, if the micro-bridge MB is not present, then the sub-word line SWL is maintained at the driving voltage VPP level. Thus, the data "1" can be successfully stored in the memory cell.

However, although the first, second, and third NMOS transistors N1, N2, and N3 are turned OFF when the sub-word line SWL is enabled, a leakage current exists due to the characteristics of the first, second, and third NMOS transistors N1, N2, and N3 in the turned OFF state. Thus, even when the micro-bridge MB is not present, the level of the sub-word line SWL will be reduced to the ground voltage VSS level due to the leakage current. For example, since the leakage current caused by the NMOS transistors N1, N2, and N3 causes the level of the sub-word line SWL to be reduced to the ground voltage level VSS, even in a normal state when the micro-bridge MB is not present, it may be recognized that the micro-bridge MB is present, thereby making it difficult to exactly detect the presence of the micro-bridge MB.

SUMMARY

A test circuit device for a semiconductor memory apparatus capable of exactly detecting the presence of the micro-bridge is described herein.

In one aspect, test circuit device for a semiconductor memory apparatus includes a main word line driving unit that generates a signal that swings between a driving voltage and one of a first voltage and a second voltage in response to a main decoding signal and a test mode signal, a local driving unit that generates a signal that swings between the driving voltage and one of the first voltage and the second voltage in response to a local decoding signal and the test mode signal, a driving voltage supplying unit that receives an output of the local driving unit and the test mode signal to supply a voltage that swings between the driving voltage and the first voltage, and a sub-word line driver that receives an output of the main word line driving unit and an output of the driving voltage supplying unit to determine whether the sub-word line is enabled or not.

In other aspects, test circuit device of a semiconductor memory apparatus includes a main word line driving unit that generates a signal that swings between a driving voltage and one of a first voltage and a second voltage in response to a main decoding signal and a test mode signal, a first low voltage controlling unit that supplies the second voltage to the main word line driving unit in response to the test mode signal, a local driving unit that generates a signal that swings between the driving voltage and one of the first voltage and the second voltage in response to a local decoding signal and the test mode signal, a second low voltage controlling unit that supplies the second voltage to the local driving unit in response to the test mode signal, a driving voltage supplying unit that receives an output of the local driving unit and the test mode signal to supply a voltage that swings between the driving voltage and the first voltage; and a sub-word line driver that receives an output of the main word line driving unit and an output of the driving voltage supplying unit to determine whether the sub-word line is enabled or not.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 3:
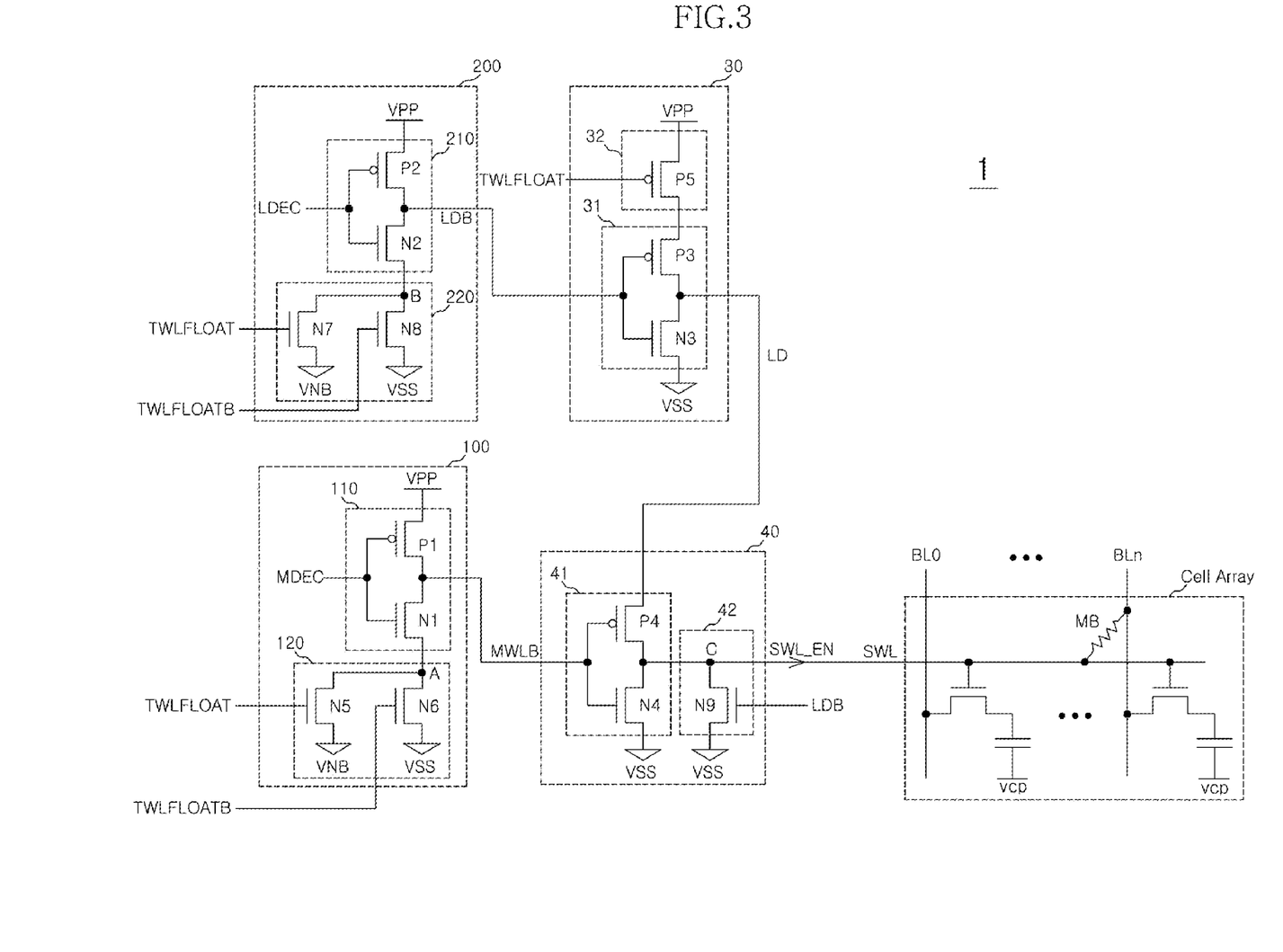
FIG. 3 is a schematic circuit diagram of an exemplary test circuit device of a semiconductor memory apparatus according to one embodiment.

FIG. 3 is a schematic circuit diagram of an exemplary test circuit device for a semiconductor memory apparatus according to one embodiment. In FIG. 3, a test circuit device 1 for a semiconductor memory apparatus can be configured to include a main word line driving unit 100, a local driving unit 200, a driving voltage supplying unit 30, and a sub-word line driver 40.

The main word line driving unit 100 can output a signal that swings between a high voltage and a low voltage in response to a main decoding signal 'MDEC' and a test mode signal 'TWLFLOAT' to supply an output signal 'MWLB' to the sub-word line driver 40. Here, for example, the high voltage may serve as a driving voltage VPP and the low voltage may serve as a first voltage or a second voltage. When the main decoding signal 'MDEC' is enabled, according to whether the test mode signal 'TWLFLOAT' is enabled or not, the main word line driving unit 100 can supply the first voltage or the second voltage to the sub-word line driver 40. In addition, when the main decoding signal 'MDEC' is disabled, the driving voltage VPP can be supplied to the sub-word line driver 40. Accordingly, for example, the first voltage can be the ground voltage VSS and the second voltage can be a negative bias voltage VNB that is lower than the ground voltage VSS. Hereinafter, for purposes of explanation, the first voltage refers to the ground voltage VSS, and the second voltage refers to the negative bias voltage VNB.

If the test mode signal 'TWLFLOAT' is enabled, then the main word line driving unit 100 can supply the second voltage, i.e., the negative bias voltage VNB, as a low voltage. Accordingly, it is possible to reduce the OFF leakage current of the NMOS transistors of the test circuit device 1. Accordingly, with the reduction of the OFF leakage current, the micro-bridge MB present between the bit line and the word line can be precisely detected.

The local driving unit 200 can provide an output signal 'LDB' to the driving voltage supplying unit 30 that swings between the high voltage and the low voltage in response to the local decoding signal 'LDEC' and the test mode signal 'TWLFLOAT'. For example, the high voltage can be the driving voltage VPP and the low voltage can be the first voltage VSS or the second voltage VNB. When the local decoding signal 'LDEC' is enabled, according to whether the test mode signal 'TWLFLOAT' is enabled or not, the local driving unit 200 can supply the first voltage VSS or the second voltage VNB to the driving voltage supplying unit 30 as the output signal 'LDB'. In addition, when the local decoding signal 'LDEC' is disabled, the driving voltage VPP can be supplied to the driving voltage supplying unit 30. If the test mode signal 'TWLFLOAT' is enabled, then the local driving unit 200 can supply the second voltage, i.e., the negative bias voltage VNB, as a low voltage. Accordingly, it is possible to reduce the OFF leakage current of the NMOS transistor that configures the test circuit device 1. Thus, if the OFF leakage current is reduced, then the micro-bridge MB present between the bit line and the word line can be precisely detected.

The driving voltage supplying unit 30 can supply a voltage that swings between the driving voltage VPP and the first voltage VSS in response to the output of the local driving unit 200 and the test mode signal 'TWLFLOAT'. When the local decoding signal 'LDEC' is disabled, the driving voltage supplying unit 30 can supply the first voltage VSS to the sub-word line driver 40. If the sub-word line SWL is enabled and then the test mode signal 'TWLFLOAT' is enabled, then the driving voltage supplying unit 30 can prevent the driving voltage VPP from being supplied to the sub-word line driver 40 to place the enabled sub-word line SWL in a floating state. Here, the sub-word line SWL can be in the floating state to detect the current leakage due to the micro-bridge MB.

The sub-word line driver 40 causes the sub-word line SWL to be enabled in response to the output signal 'MWLB' of the main word line driving unit 100.

In FIG. 3, the main word line driving unit 100 can include a first signal selector 110 receiving the main decoding signal 'MDEC' as an input, and a first low voltage supplying unit 120 that supplies the first voltage VSS or the second voltage VNB to the first signal selector 110 according to whether the test mode signal 'TWLFLOAT' is enabled or not. When the main decoding signal 'MDEC' is disabled, the first signal selector 110 can supply the driving voltage VPP to the sub-word line driver 40 as the output signal 'MWLB'. When the main decoding signal 'MDEC' is enabled, the first signal selector 110 can supply the first voltage VSS or the second voltage VNB to the sub-word line driver 40 as the output signal "MWLB'.

The first low voltage supplying unit 120 can supply the first or second voltage VSS or VNB to the first signal selector 110 in response to the test mode signal 'TWLFLOAT'. The first low voltage supplying unit 120 can supply the second voltage VNB to the first signal selector 110 when the test mode signal 'TWLFLOAT' is enabled, and can supply the first voltage VSS to the first signal selector 110 when the test mode signal 'TWLFLOAT' is disabled.

The first signal selector 110 can be configured to include a first PMOS transistor P1, wherein the main decoding signal 'MDEC' can be supplied through a gate terminal and the driving voltage VPP can be supplied through a source terminal, and a first NMOS transistor N1, wherein the main decoding signal 'MDEC' can be supplied through a gate terminal, a source terminal can be connected to a first node A, and a drain terminal can be connected to a drain terminal of the first PMOS transistor P1.

The first low voltage supplying unit 120 can include a fifth NMOS transistor N5, wherein the test mode signal 'TWLFLOAT' can be supplied through a gate terminal, the second voltage VNB can be supplied through a source terminal, and a drain terminal can be connected to the first node A, and a sixth NMOS transistor N6, wherein an inverted test mode signal 'TWLFLOATB' can be supplied through a gate terminal, the first voltage VSS can be supplied through a source terminal, and a drain terminal can be connected to the first node A.

The local driving unit 200 can include a second signal selector 210 that can receive the local decoding signal 'LDEC' as an input, and a second low voltage supplying unit 220 that can supply the first voltage VSS or the second voltage VNB to the second signal selector 210 according to whether the test mode signal 'TWLFLOAT' is enabled or not. When the local decoding signal 'LDEC' is disabled, the second signal selector 210 can supply the driving voltage VPP to the driving voltage supplying unit 30 as the output signal 'LDB'. When the local decoding signal 'LDEC' is enabled, the second signal selector 210 can supply the first voltage VSS or the second voltage VNB to the driving voltage supplying unit 30 as the output signal 'LDB'.

The second low voltage supplying unit 220 can supply the first voltage VSS or the second voltage VNB to the second signal selector 210 in response to the test mode signal 'TWLFLOAT'. The second low voltage supplying unit 220 can supply the second voltage VNB to the second signal selector 210 when the test mode signal 'TWLFLOAT' is enabled, and can supply the first voltage VSS to the second signal selector 210 when the test mode signal 'TWLFLOAT' is disabled.

The second signal selector 210 can include a second PMOS transistor P2, wherein the local decoding signal 'LDEC' can be supplied through a gate terminal and the driving voltage VPP can be supplied through a source terminal, and a second NMOS transistor N2, wherein the local decoding signal 'LDEC' can be supplied through a gate terminal, a source terminal can be connected to a second node B, and a drain terminal can be connected to a drain terminal of the second PMOS transistor P2.

The second low voltage supplying unit 220 can include a seventh NMOS transistor N7, wherein the test mode signal 'TWLFLOAT' can be supplied through a gate terminal and a drain terminal can be connected to the second node B, and an eighth NMOS transistor N8, wherein an inverted test mode signal 'TWLFLOATB' can be supplied through a gate terminal and a drain terminal can be connected to the second node B.

The driving voltage supplying unit 30 can include a detector 32 that can receive the test mode signal 'TWLFLOAT', and a voltage selector 31 that can receive the output signal 'LDB' of the local driving unit 200. The detector 32 can determine whether to supply the driving voltage VPP to the voltage selector 31 in response to the test mode signal 'TWLFLOAT'. For example, if the test mode signal 'TWLFLOAT' is enabled, then the detector 32 can not supply the driving voltage VPP to the voltage selector 31. Conversely, if the test mode signal 'TWLFLOAT' is disabled, then the detector 32 can supply the driving voltage VPP to the voltage selector 31. Therefore, when the test mode signal 'TWLFLOAT' is enabled, the driving voltage VPP is not supplied to the sub-word line driver 40 as the output signal 'LD', thereby detecting the micro-bridge MB due to the floating state of the sub-word line SWL.

The detector 32 can include a fifth PMOS transistor P5, wherein the test mode signal 'TWLFLOAT' can be supplied through a gate terminal and the driving voltage VPP can be supplied through a source terminal.

The voltage selector 31 can include a third PMOS transistor P3, wherein the output signal 'LDB' of the local driving unit 200 can be supplied through a gate terminal and a source terminal can be connected to the drain terminal of the fifth PMOS transistor P5, and a third NMOS transistor N3, wherein the output signal LDB of the local driver 40 can be supplied through a gate terminal, the first voltage VSS can be supplied through a source terminal, and a drain terminal can be connected to a drain terminal of the third PMOS transistor P3.

The sub-word line driver 40 can include a third signal selector 41 that receives the output signal 'MWLB' of the main word line driving unit 100 and a signal supplying unit 42 that can receive the output signal 'LDB' of the local driving unit 200. The third signal selector 41 can supply a signal, i.e., the output signal 'LD', that swings between a voltage supplied from the driving voltage supplying unit 30 and the first voltage VSS to the sub-word line SWL in response to the output signal 'MWLB' of the main word line driving unit 100. The signal supplying unit 42 can determine whether to produce the output of the third signal selector 41 to the sub-word line SWL in response to the output signal 'LDB' of the local driving unit 200.

The third signal selector 41 can include a fourth PMOS transistor P4, wherein the output signal 'MWLB' of the main word line driving unit 100 can be supplied through a gate terminal, the output signal 'LD' of the driving voltage supplying unit 30 can be supplied through a source terminal, and a drain terminal can be connected to a third node C, and a fourth NMOS transistor N4, wherein the output signal 'MWLB' of the main word line driving unit 100 can be supplied through a gate terminal, the first voltage VSS can be supplied through a source terminal, and a drain terminal can be connected to the third node C.

The signal supplying unit 42 can include a ninth NMOS transistor N9, wherein the output signal 'LDB' of the local driving unit 200 can be supplied through a gate terminal and a drain terminal can be connected to the third node C. Here, the sub-word line driver 40 can supply a sub-word line enable signal 'SWL_EN' to the sub-word line SWL through the third node C.

An exemplary operation of a test circuit device for a semiconductor memory apparatus 1 will be described with reference to FIGS. 2 and 3.

In a state where data "0" is stored in a memory cell of a semiconductor memory device at an initial stage, when an active command signal 'ACT' is input, the main decoding signal 'MDEC' and the local decoding signal 'LDEC' can be enabled at a high level. In this case, the disabled state of the test mode signal 'TWLFLOAT' can be maintained. Since the test mode signal 'TWLFLOAT' is disabled, the fifth NMOS transistor N5 of the first low voltage supplying unit 120 of the main word line driving unit 100 can be turned OFF, and the sixth NMOS transistor N6 can be turned ON. Accordingly, the first voltage VSS can be supplied to the first signal selector 110. If the main decoding signal 'MDEC' is enabled at a high level, then the first PMOS transistor P1 of the first signal selector 110 can be turned OFF and the first NMOS transistor N1 can be turned ON. Accordingly, the first voltage VSS can be supplied to the sub-word line driver 40 through the first NMOS transistor N1 that is turned ON.

Since the test mode signal 'TWLFLOAT' is disabled, the seventh NMOS transistor N7 of the second low voltage supplying unit 220 of the local driving unit 200 can be turned OFF, and the eighth NMOS transistor N8 can be turned ON. Accordingly, the first voltage VSS can be supplied to the second signal selector 210. If the local decoding signal 'LDEC' is enabled at a high level, then the second PMOS transistor P2 of the second signal selector 210 can be turned OFF and the second NMOS transistor N2 can be turned ON. Thus, the first voltage VSS can be supplied to the driving voltage supplying unit 30 through the second NMOS transistor N2 that is turned ON.

In addition, since the driving voltage supplying unit 30 can receive the output signal 'LDB', which can be enabled at a low level through the local driving unit 200, the PMOS transistor P3 of the voltage selector 31 of the driving voltage supplying unit 30 can be turned ON, and the third NMOS transistor N3 can be turned OFF. Furthermore, since the test mode signal 'TWLFLOAT' can be disabled, the fifth PMOS transistor P5 of the detector 32 can be turned ON and the driving voltage VPP can be supplied to the sub-word line driver 40 through the fifth PMOS transistor P5 and the third PMOS transistor P3.

The sub-word line driver 40 can receive the output signal 'MWLB' of the main word line driving unit 100, which can be enabled at a low level. Accordingly, the fourth PMOS transistor P4 of the third signal selector 41 of the sub-word line driver 40 can be turned ON, and the fourth NMOS transistor N4 can be turned OFF. In addition, the ninth NMOS transistor N9 that receives the output signal 'LDB' of the local driving unit 200 enabled at a low level can be turned OFF. The driving voltage VPP that is supplied from the driving voltage supplying unit 30 through the turned ON fourth PMOS transistor P4 can be supplied as the sub-word line enable signal 'SWL_EN'. Here, the sub-word line enable signal 'SWL_EN' that is enabled at a high level by the driving voltage VPP can cause the sub-word line SWL to be enabled at the same level as the driving voltage VPP.

If the sub-word line SWL is enabled, then a bit line BL and a bit (bar) line $\overline{BL}$ can be amplified by a bit line sense amplifier. Accordingly, after the charge sharing operation, the data "0" can be stored in the memory cell node again. Then, in order to detect the micro-bridge MB, the test mode signal 'TWLFLOAT' can be enabled at a high level. If the test mode signal 'TWLFLOAT' is enabled at a high level, then the fifth PMOS transistor P5 of the detector 32 can be turned OFF, and the driving voltage VPP that is supplied to the sub-word line SWL can be intercepted. Accordingly, the enabled sub-word line SWL can be in a floating state. If the floating state of the sub-word line SWL is maintained for a long time period, the sub-word line SWL can become disabled or can be maintained in the enabled state, according to the presence of the micro-bridge MB between the word line and the bit line. Thus, if the micro-bridge MB is present, the current path can be generated, thereby decreasing the level of the sub-word line SWL to a ground voltage VSS level.

When the sub-word line SWL is enabled, the third NMOS transistor N3 of the voltage selector 31, the fourth NMOS transistor N4 of the third voltage selector 41, and the ninth NMOS transistor N9 of the signal supplying unit 42 can all be turned OFF. However, the OFF leakage current exists due to the characteristics of the NMOS transistors. Even when the micro-bridge MB is not present, the level of the sub-word line SWL may be reduced to the ground voltage VSS level. Thus, if the test mode signal 'TWLFLOAT' is enabled at a high level, then the first low voltage supplying unit 120 and the second low voltage supplying unit 220 can supply the second voltage VNB to the first signal selector 110 and the second signal selector 210, instead of the first voltage VSS. For example, when the test mode signal 'TWLFLOAT' is enabled, the sixth NMOS transistor N6 of the first low voltage supplying unit 120 can be turned OFF and the fifth NMOS transistor N5 can be turned ON. Thus, the second voltage VNB can be supplied to the source terminal of the first NMOS transistor N1 of the first signal selector 110. Similarly, the eighth NMOS transistor N8 of the first signal selector 110 can be turned OFF, and the seventh NMOS transistor N7 can be turned ON to supply the second voltage VNB to the source terminal of the second NMOS transistor N2 of the second signal selector instead of the first voltage VSS.

By supplying the second voltage VNB to the source terminals of the first and second NMOS transistors N1 and N2, instead of the first voltage VSS, the fourth NMOS transistor N4 of the third signal selector that receives the output signal 'MWLB' of the first signal selector through the gate terminal, the third NMOS transistor N3 of the voltage selector 31 that receives the output signal 'LDB' of the second signal selector through the gate terminal, and the ninth NMOS transistor N9 of the signal supplying unit 42 can all be turned OFF quickly. Thus, the OFF leakage current from the NMOS transistors N3, N4, and N9 can be significantly reduced.

If the data "1" is written into a memory cell by a write operation and the precharge operation PCG is performed, then the test mode signal 'TWLFLOAT' can be disabled. If the micro-bridge MB is not present, then the sub-word line SWL can be maintained at the driving voltage VPP level. Thus, when the active command signal ACT is input again, the data "1" can be read from the memory cell node. In contrast, if the data "1" cannot be read from the memory cell node, then the micro-bridge MB can be exactly detected.

According to the one embodiment, in order to detect the micro-bridge MB, when the test mode signal is enabled, the leakage current prevent unit can supply the negative bias voltage to rapidly reduce the OFF leakage current of the NMOS transistors, thereby making it possible to detect when the level of the sub-word line is reduced due to the presence of the micro-bridge.

Figure 4:
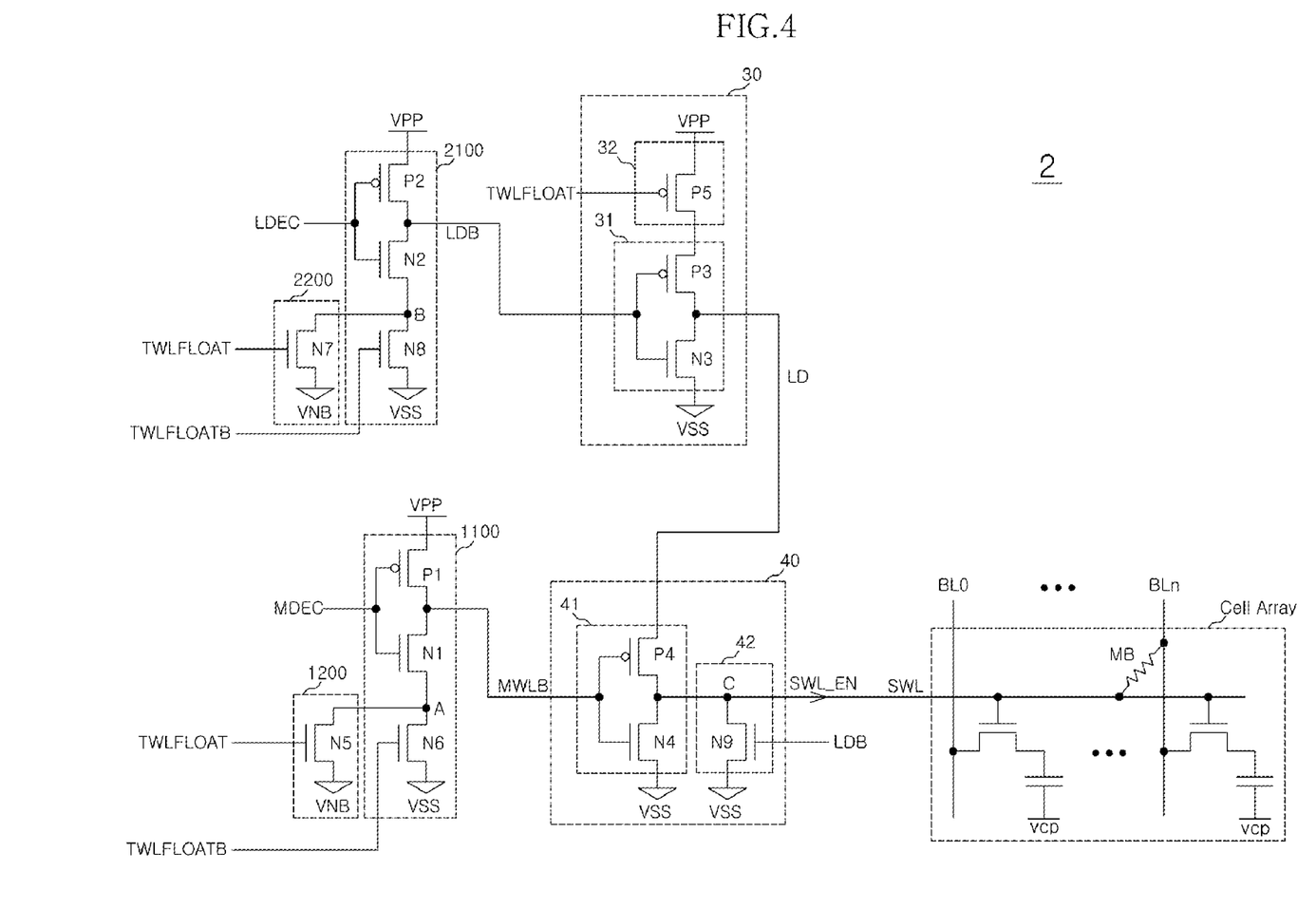
FIG. 4 is a schematic circuit diagram of an exemplary test circuit device of a semiconductor memory apparatus according to other embodiment.

FIG. 4 is a schematic circuit diagram of another exemplary test circuit device for a semiconductor memory apparatus according to one embodiment. In FIG. 4, a test circuit device 2 for a semiconductor memory apparatus can be configured to include a main word line driving unit 1100, a first low voltage controlling unit 1200, a local driving unit 2100, a second low voltage controlling unit 2200, a driving voltage supplying unit 30, and a sub-word line driver 40.

In FIG. 4, the main word line driving unit 1100 can be configured to a signal that swings between the driving voltage VPP and one of the first voltage VSS and the second voltage VNB in response to the main decoding signal MDEC and the test mode signal TWLFLOAT. The first low voltage controlling unit 1200 can be configured to supply the second voltage 1200 to the main word line driving unit 1100 in response to the test mode signal TWLFLOAT.

The local driving unit 2100 can be configured to generate a signal that swings between the driving voltage VPP and one of the first voltage VSS and the second voltage VNB in response to a local decoding signal LDEC and the test mode signal TWLFLOAT. The second low voltage controlling unit 2200 that supplies the second voltage VNB to the local driving unit 2100 in response to the test mode signal TWLFLOAT.

In FIG. 4, the main word line driving unit 1100 can be configured to include a first PMOS transistor P1, a first and a sixth NMOS transistors N1 and N6, and the first low voltage controlling unit 1200 can be configured to include a fifth NMOS transistor N5. The local driving unit 2100 can be configured to include a second PMOS transistor P2, a second and a eighth NMOS transistors N2 and N8, and the second low voltage controlling unit 2200 can be configured to include a seventh NMOS transistor N7.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A test circuit device for a semiconductor memory apparatus, comprising:
   a main word line driving unit that generates a signal that swings between a driving voltage and one of a first voltage and a second voltage in response to a main decoding signal and a test mode signal;
   a local driving unit that generates a signal that swings between the driving voltage and one of the first voltage and the second voltage in response to a local decoding signal and the test mode signal;
   a driving voltage supplying unit that receives an output of the local driving unit and the test mode signal to supply a voltage that swings between the driving voltage and the first voltage; and
   a sub-word line driver that receives an output of the main word line driving unit and an output of the driving voltage supplying unit to determine whether the sub-word line is enabled or not.

2. The test circuit device of claim 1, wherein the main word line driving unit includes:
   a first signal selector that supplies a signal that swings between the driving voltage and the one of the first voltage and the second voltage in response to the main decoding signal; and
   a first low voltage supplying unit that supplies one of the first voltage and the second voltage to the first signal selector in response to the test mode signal.

3. The test circuit device of claim 2, wherein the first low voltage supplying unit supplies the second voltage to the first signal selector when the test mode signal is enabled, and supplies the first voltage to the first signal selector when the test mode signal is disabled.

4. The test circuit device of claim 2, wherein the first low voltage supplying unit includes:

a first NMOS transistor having a gate terminal receiving the test mode signal, a source terminal receiving the second voltage, and a drain terminal connected to a first node; and
   a second NMOS transistor having a gate terminal receiving an inverted test mode signal, a source terminal receiving the first signal, and a drain terminal connected to the first node,
   wherein one of the first voltage and the second voltage is supplied to the first signal selector through the first node.

5. The test circuit device of claim 1, wherein the local driving unit includes:
   a second signal selector that supplies a signal that swings between the driving voltage and one of the first voltage and the second voltage in response to the local decoding signal; and
   a second low voltage supplying unit that supplies one of the first voltage and the second voltage to the second signal selector in response to the test mode signal.

6. The test circuit device of claim 5, wherein the second low voltage supplying unit supplies the second voltage to the second signal selector when the test mode signal is enabled, and supplies the first voltage to the second signal selector when the test mode signal is disabled.

7. The test circuit device of claim 5, wherein the second low voltage supplying unit includes:
   a third NMOS transistor having a gate terminal receiving the test mode signal, a source terminal receiving the second voltage, and a drain terminal connected to a second node; and
   a fourth NMOS transistor having a gate terminal receiving the inverted test mode signal, a source terminal receiving the first signal, and a drain terminal connected to the second node,
   wherein one of the first voltage and the second voltage is supplied to the second signal selector through the second node.

8. The test circuit device of claim 1, wherein the driving voltage supplying unit includes:
   a voltage selector that supplies the voltage that swings between the driving voltage and the first voltage in response to the output of the local driving unit; and
   a detector that determines to supply the driving voltage to the voltage selector in response to the test mode signal.

9. The test circuit device of claim 8, wherein the detector does not supply the driving voltage to the voltage selector when the test mode signal is enabled, and supplies the driving voltage to the signal selector when the test mode signal is disabled.

10. The test circuit device of claim 1, wherein the first voltage includes a ground voltage.

11. The test circuit device of claim 1, wherein the second voltage includes a negative bias voltage that is lower than the ground voltage.

12. The test circuit device of claim 1, wherein the sub-word line driver includes:
    a third signal selector that outputs a signal that swings between the output of the driving voltage supplying unit and the first voltage in response to the output of the main word line driving unit; and
    a signal supplying unit that supplies the output of the third signal selector to the sub-word line.

13. A test circuit device for a semiconductor memory apparatus, comprising:
    a main word line driving unit that generates a signal that swings between a driving voltage and one of a first voltage and a second voltage in response to a main decoding signal and a test mode signal;

a first low voltage controlling unit that supplies the second voltage to the main word line driving unit in response to the test mode signal;

a local driving unit that generates a signal that swings between the driving voltage and one of the first voltage and the second voltage in response to a local decoding signal and the test mode signal;

a second low voltage controlling unit that supplies the second voltage to the local driving unit in response to the test mode signal;

a driving voltage supplying unit that receives an output of the local driving unit and the test mode signal to supply a voltage that swings between the driving voltage and the first voltage; and a sub-word line driver that receives an output of the main word line driving unit and an output of the driving voltage supplying unit to determine whether the sub-word line is enabled or not.

14. The test circuit device of claim 13, wherein the main word line driving unit supplies the signal that swings between the driving voltage and the first voltage when the test mode signal is disabled, and supplies the signal that swings between the driving voltage and the second voltage when the test mode signal is enabled.

15. The test circuit device of claim 14, wherein the first low voltage controlling unit supplies the second voltage to the main word line driving unit when the test mode signal is enabled.

16. The test circuit device of claim 13, wherein the local driving unit supplies the signal that swings between the driving voltage and the first voltage when the test mode signal is disabled, and supplies the signal that swings between the driving voltage and the second voltage when the test mode signal is enabled.

17. The test circuit device of claim 16, wherein the second low voltage controlling unit supplies the second voltage to the local driving unit when the test mode signal is enabled.

18. The test circuit device of claim 13, wherein the driving voltage supplying unit includes:

a voltage selector that supplies the voltage that swings between the driving voltage and the first voltage in response to the output of the local driving unit; and a detector that determines to supply the driving voltage to the voltage selector in response to the test mode signal.

19. The test circuit device of claim 18, wherein the detector does not supply the driving voltage to the voltage selector when the test mode signal is enabled, and supplies the driving voltage to the signal selector when the test mode signal is disabled.

20. The test circuit device of claim 13, wherein the first voltage includes a ground voltage.

21. The test circuit device of claim 13, wherein the second voltage includes a negative bias voltage that is lower than the ground voltage.

22. The test circuit device of claim 13, wherein the sub-word line driver includes:

a signal selector that outputs a signal that swings between the output of the driving voltage supplying unit and the first voltage in response to the output of the main word line driving unit; and a signal supplying unit that supplies the output of the signal selector to the sub-word line.

* * * * *